United States Patent
Rapp et al.

(10) Patent No.: US 6,652,777 B2
(45) Date of Patent: Nov. 25, 2003

(54) METHOD AND APPARATUS FOR EMI SHIELDING

(75) Inventors: Martin L. Rapp, Grover, MO (US); Jeff McFadden, Blairstown, NJ (US); Frank T. McNally, Bryn Mawr, PA (US)

(73) Assignee: Amesbury Group, Inc., Amesbury, MA (US)

( * ) Notice: Subject to any disclaimer, the term of this patent is extended or adjusted under 35 U.S.C. 154(b) by 31 days.

(21) Appl. No.: 09/795,669

(22) Filed: Feb. 28, 2001

(65) Prior Publication Data

US 2001/0028558 A1 Oct. 11, 2001

Related U.S. Application Data

(63) Continuation-in-part of application No. 09/768,428, filed on Jan. 24, 2001.
(60) Provisional application No. 60/185,597, filed on Feb. 28, 2000.

(51) Int. Cl.[7] .................... H01B 1/02; C08K 3/10; B32B 27/01; G21F 1/12
(52) U.S. Cl. ............... 252/511; 252/500; 252/502; 252/503; 252/506; 252/514; 428/297; 428/299; 428/300; 428/315; 524/403; 524/439; 524/440
(58) Field of Search .................. 252/500, 502, 252/503, 506, 511, 514; 523/137; 524/403, 413, 435, 439, 440; 162/138; 264/104, 105; 428/297, 299, 300, 316

(56) References Cited

U.S. PATENT DOCUMENTS

| 4,102,033 A | 7/1978 | Emi et al. .................. 29/527.3 |
| 4,545,914 A | 10/1985 | Graiver et al. .............. 252/511 |
| 4,596,670 A * | 6/1986 | Liu ............................ 252/511 |
| 4,645,566 A * | 2/1987 | Kato et al. ................... 162/138 |

(List continued on next page.)

FOREIGN PATENT DOCUMENTS

| DE | 87 12 861 U | 12/1987 | ........... H05K/9/00 |
| EP | 0 643 551 A1 | 3/1995 | ........... H05K/9/00 |
| GB | 2 158 737 A | 11/1985 | ........... H01B/13/22 |
| GB | 2 198 734 A | 6/1988 | ........... C08K/3/00 |
| GB | 2 269 767 A | 2/1994 | ........... B05B/12/00 |
| JP | 59225927 | * 12/1984 | ........... B29D/7/24 |
| JP | 01203447 | * 8/1989 | ........... C08K/7/00 |
| JP | 01257047 | * 10/1989 | ........... B32B/27/18 |
| WO | WO 97/34459 | 9/1997 | ........... H05K/9/00 |
| WO | WO 99/40770 | 8/1999 | ........... H05K/9/00 |

OTHER PUBLICATIONS

PTF Inks. Acheson a National Starch & Chemical Company. [retrieved on Feb. 17, 2000]. Retrieved from the Internet: <URL: http://www.achesoncolloids.com/ptfdata.html>.
Electronic Materials and Specialty Coatings. Acheson a National Starch & Chemical Company. [retrieved on Feb. 17, 2000]. Retrieved from the Internet: <URL: http://www.achesoncolloids.com/ACC22.HTML>.

(List continued on next page.)

Primary Examiner—Mark Kopec
Assistant Examiner—Kallambella Vijayakumar
(74) Attorney, Agent, or Firm—Testa, Hurwitz & Thibeault, LLP

(57) ABSTRACT

Disclosed are methods for manufacturing electromagnetic interference shields for use in nonconductive housings of electronic equipment. In one embodiment, the shield may include an electrically nonconductive substrate, such as a thermoformable film, coated with an electrically conductive element, such as an extensible ink or a combination of conductive fibers with an extensible film. In one embodiment, a compressible conductive perimeter gap gasket may be formed by using a form in place process.

4 Claims, 5 Drawing Sheets

U.S. PATENT DOCUMENTS

| | | | |
|---|---|---|---|
| 4,806,272 A | 2/1989 | Wiley | 252/511 |
| 4,818,437 A | 4/1989 | Wiley | 252/511 |
| 4,818,438 A | 4/1989 | Wiley | 252/511 |
| 4,889,750 A | 12/1989 | Wiley | 428/34.2 |
| 4,900,618 A | 2/1990 | O'Connor et al. | 428/328 |
| 4,910,072 A | 3/1990 | Morgan et al. | 428/212 |
| 4,968,854 A | 11/1990 | Benn, Sr. et al. | 174/35 GC |
| 5,068,493 A | 11/1991 | Benn, Sr. et al. | 174/35 GC |
| 5,075,037 A | 12/1991 | Morgan et al. | 252/513 |
| 5,082,734 A | 1/1992 | Vaughn | 428/411.1 |
| 5,107,070 A | 4/1992 | Benn, Sr. et al. | 174/35 GC |
| 5,141,770 A | 8/1992 | Benn, Sr. et al. | 427/58 |
| 5,286,415 A | 2/1994 | Buckley et al. | 252/502 |
| 5,318,855 A | 6/1994 | Glovatsky et al. | 428/457 |
| 5,382,384 A * | 1/1995 | Baigrie et al. | 252/511 |
| 5,389,403 A | 2/1995 | Buckley et al. | 427/372.2 |
| 5,393,928 A | 2/1995 | Cribb et al. | 174/36 |
| 5,407,699 A | 4/1995 | Myers | 427/121 |
| 5,480,929 A | 1/1996 | Miyata | 524/413 |
| 5,489,489 A | 2/1996 | Swirbel et al. | 428/615 |
| 5,696,196 A | 12/1997 | DiLeo | 524/445 |
| 5,804,912 A | 9/1998 | Park | 313/402 |
| 5,811,050 A | 9/1998 | Gabower | 264/299 |
| 5,993,698 A | 11/1999 | Frentzel et al. | 252/511 |
| 6,013,203 A | 1/2000 | Paneccasio, Jr. et al. | 252/512 |
| 6,537,359 B1 * | 3/2003 | Spa | 106/31.92 |

OTHER PUBLICATIONS

Electrodag® 18DB70X VOC Exempt Silver Conductive Coating. Acheson a National Starch & Chemical Company. [retrieved on Feb. 17, 2000]. Retrieved from the Internet: <URL: http://www.achesoncolloids.com/18db70x.html>.

GE Structured Products. GE Structured Products. [retrieved on Feb. 17, 2000]. Retrieved from the Internet: <URL: http://structuredproducts.ge.com/>.

Electrodag® Polymer Thick Film Inks. Acheson Colloids Company. [retrieved on Feb. 17, 2000]. Retrieved from the Internet: <URL: http://www.achesoncolloids.com/PTF-S-G.html>.

* cited by examiner

POSITIVE FORMING
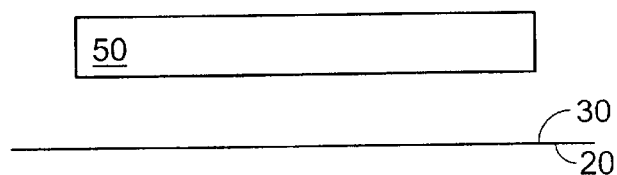
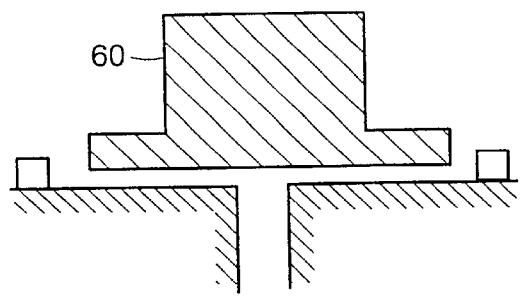
FIG. 4A
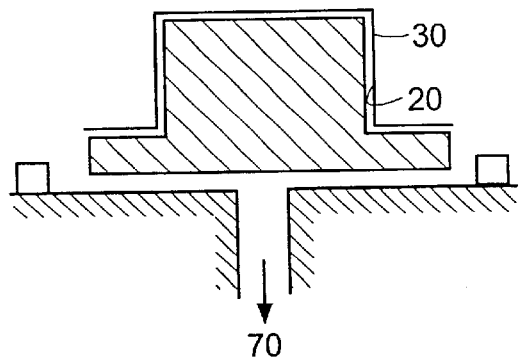
FIG. 4B
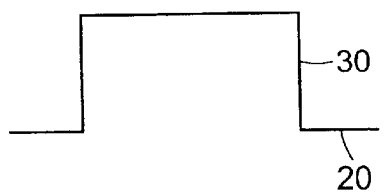
FIG. 4C Formshield Product Option Matrix

| Conductive Materials | Base Material | Manufacturing Method | Surf. Resistivity Unformed (ohms/square) | Surf. Resistivity Formed (ohms/square) | SE(dB) Unformed @10GHz | SE(dB) Formed @10GHz | Thk (mils) | Exemplary Draw (inches) |
|---|---|---|---|---|---|---|---|---|
| Ag Loaded | Silicone | Wet Coating | 0.03 | - | 62 | - | 4 | - |
| Ag/Cu Flake | Silicone | - | - | - | - | - | - | - |
| Ag/Nylon Fibers | Silicone | - | - | - | - | - | - | - |
| Ag/Nylon Fiber | PE Mat + PC | Carding | 0.50 | 1.00 | 40 | 42 | 10 | 0.6 |
| Ag/Nylon | PE Fiber + PC | Carding | 0.09 | 0.13 | 60 | 60 | 8 | 0.6 |
| Ag Carbon Fibers | PE Mat + PC | Carding | - | - | - | - | - | - |
| Sn over Cu flash | PC-ABS | Plating | 0.02 | 0.08 | 72 | 70 | 4 | 0.5 |
| Ag Particle Ink | PC | Coating | 0.40 | 0.50 | 50 | 35 | 10 | 1 |
| Ag/Nylon Fiber | PE,PP,PS,PC | Flocking | 0.35 | - | - | - | 5 | - |
| Ag/Nylon | PE,PP,PS,PC | Dry Laid Screening | - | - | - | - | - | - |
| Sn | PE,PP,PS,PC | Vac. Metal/Ion Sputter | 0.10 | - | - | - | 1 | - |

FIG. 5

METHOD AND APPARATUS FOR EMI SHIELDING

RELATED APPLICATIONS

This application incorporates by reference in its entirety and claims priority to U.S. Provisional Patent Application Ser. No. 60/185,597 entitled Methods and Apparatus for EMI Shielding filed on Feb. 28, 2000. This application also incorporates by reference in its entirety and claims priority to U.S. patent application entitled Methods and Apparatus for EMI Shielding filed on Jan. 24, 2001, Ser. No. 09/768,428.

FIELD OF THE INVENTION

This invention relates to methods of manufacturing electromagnetic interference ("EMI") shields and the EMI shields produced thereby.

BACKGROUND OF THE INVENTION

As used herein, the term EMI should be considered to refer generally to both EMI and radio frequency interference ("RFI") emissions, and the term electromagnetic should be considered to refer generally to electromagnetic and radio frequency.

During normal operation, electronic equipment generates undesirable electromagnetic energy that can interfere with the operation of proximately located electronic equipment due to EMI transmission by radiation and conduction. The electromagnetic energy can be of a wide range of wavelengths and frequencies. To minimize the problems associated with EMI, sources of undesirable electromagnetic energy may be shielded and electrically grounded. Shielding is designed to prevent both ingress and egress of electromagnetic energy relative to a housing or other enclosure in which the electronic equipment is disposed. Since such enclosures often include gaps or seams between adjacent access panels and around doors, effective shielding is difficult to attain, because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

Specialized EMI gaskets have been developed for use in gaps and around doors to provide a degree of EMI shielding while permitting operation of enclosure doors and access panels. To shield EMI effectively, the gasket should be capable of absorbing or reflecting EMI as well as establishing a continuous electrically conductive path across the gap in which the gasket is disposed. Conventional metallic gaskets manufactured from copper doped with beryllium are widely employed for EMI shielding due to their high level of electrical conductivity. Due to inherent electrical resistance in the gasket, however, a portion of the electromagnetic field being shielded induces a current in the gasket, requiring that the gasket form a part of an electrically conductive path for passing the induced current flow to ground. Failure to ground the gasket adequately could result in radiation of an electromagnetic field from a side of the gasket opposite the primary EMI field.

In addition to the desirable qualities of high conductivity and grounding capability, EMI gaskets in door applications should be elastically compliant and resilient to compensate for variable gap widths and door operation, yet tough to withstand repeated door closure without failing due to metal fatigue, compression set, or other failure mechanism. EMI gaskets should also be configured to ensure intimate electrical contact with proximate structure while presenting minimal force resistance per unit length to door closure, as the total length of an EMI gasket to shield a large door can readily exceed several meters. It is also desirable that the gasket be resistant to galvanic corrosion which can occur when dissimilar metals are in contact with each other for extended periods of time. Very low resistance and, concomitantly, very high electrical conductivity are becoming required characteristics of EMI gaskets due to increasing shielding requirements. Low cost, ease of manufacture, and ease of installation are also desirable characteristics for achieving broad use and commercial success.

Conventional metallic EMI gaskets, often referred to as copper beryllium finger strips, include a plurality of cantilevered or bridged fingers forming linear slits therebetween. The fingers provide spring and wiping actions when compressed. Other types of EMI gaskets include closed-cell foam sponges having metallic wire mesh knitted thereover or metallized fabric bonded thereto. Metallic wire mesh may also be knitted over silicone tubing. Strips of rolled metallic wire mesh, without foam or tubing inserts, are also employed.

One problem with metallic finger strips is that to ensure a sufficiently low door closure force, the copper finger strips are made from thin stock, for example on the order of about 0.05 mm (0.002 inches) to about 0.15 mm (0.006 inches) in thickness. Accordingly, sizing of the finger strip uninstalled height and the width of the gap in which it is installed should be controlled to ensure adequate electrical contact when installed and loaded, yet prevent plastic deformation and resultant failure of the strip due to overcompression of the fingers. To enhance toughness, beryllium is added to the copper to form an alloy; however, the beryllium adds cost Finger strips are also expensive to manufacture, in part due to the costs associated with procuring and developing tooling for outfitting presses and rolling machines to form the complex contours required. Changes to the design of a finger strip to address production or performance problems require the purchase of new tooling and typically incur development costs associated with establishing a reliable, high yield manufacturing process. Notwithstanding the above limitations, metallic finger strips are commercially accepted and widely used. Once manufacturing has been established, large quantities of finger strips can be made at relatively low cost.

Metallized fabric covered foam gaskets avoid many of the installation and performance disadvantages of finger strips; however, they can be relatively costly to produce due to expensive raw materials. Nonetheless, EMI gaskets manufactured from metallized fabrics having foam cores are increasing in popularity, especially for use in equipment where performance is a primary consideration.

As used herein, the term metallized fabrics include articles having one or more metal coatings disposed on woven, nonwoven, or open mesh carrier backings or substrates and equivalents thereof. See, for example, U.S. Pat. No. 4,900,618 issued to O'Connor et al., U.S. Pat. No. 4,910,072 issued to Morgan et al.; U.S. Pat. No. 5,075,037 issued to Morgan et al., and U.S. Pat. No. 5,393,928 issued to Cribb et al., the disclosures of which are herein incorporated by reference in their entirety. Metallized fabrics are commercially available in a variety of metal and fabric carrier backing combinations. For example, pure copper on a nylon carrier, nickel-copper alloy on a nylon carrier, and pure nickel on a polyester mesh carrier are available under the registered trademark Flectron® metallized materials from Advanced Performance Materials located in St. Louis, Mo. An aluminum foil on a polyester mesh carrier is available from Neptco, located in Pawtucket, R.I.

The choice of metal is guided, in part, by installation conditions of the EMI shield. For example, a particular metal might be chosen due to the composition of abutting body metal in the enclosure to avoid galvanic corrosion of the EMI shield, which could increase electrical resistance and deteriorate electrical grounding performance. Metallized tapes are desirable both for ease of application as well as durability.

Metallized fabrics, such as those described in the O'Connor et al. patent mentioned hereinabove, are generally made by electroless plating processes, such as electroless deposition of copper or other suitable metal on a catalyzed fiber or film substrate. Thereafter one or more additional layers of metal, such as nickel, may be electrolessly or electrolytically deposited on the copper. These additional layers are applied to prevent the underlying copper layer from corroding, which would increase the resistance and thereby decrease the electrical conductivity and performance of any EMI gasket made therefrom. The additional nickel layer on the copper also provides a harder surface than the base copper.

SUMMARY OF THE INVENTION

Two developments have been progressing independently for several years in the area of EMI shields for nonconductive enclosures, such as molded plastic housings for cellular telephones, computers, and the like. The first development is a form in place ("FIP") process. See, for example, U.S. Pat. No. 5,822,729 entitled Process for Producing a Casing Providing a Screen Against Electromagnetic Radiation, the disclosure of which is incorporated herein by reference in its entirety. A goal of the FIP process is to produce a conductive and compressible elastomeric EMI gasket that can be directly applied to the substrate to be shielded, thereby eliminating the step of attaching the EMI gasket to the workpiece at the assembly plant. One problem with the FIP process is that it is necessary to have relatively complex and expensive dispensing equipment at the casting or molding plant, or at the assembly plant. As the capacity utilization of this equipment may be quite low, due to the use on a single component this is a risky and potentially uneconomic situation.

The second development in the area of EMI shielding is the production of conductive coatings, especially an extensible conductive coating, which is a coating with high conductivity that can be applied to a film, or other flexible substrate, that is later formed to a desired shape without substantial degradation of conductivity. See, for example, U.S. Pat. No. 5,286,415 entitled Water-Based Polymer Thick Film Conductive Ink and U.S. Pat. No. 5,389,403 entitled Water-based Polymer Thick Conductive Ink, the disclosures of which are incorporated herein by reference in their entirety. Acheson Colloids Company, located at Port Huron, Mich., has developed a product based on silver ink that when coated on a thermoformable film, such as General Electric's Lexan®, retains high electrical conductivity even when drawn to relatively high elongations. The thermoformable film may be formed to relatively complex three dimensional shapes known as "cans." The thermoformable film with extensible coating can replace conventional metal cans, as well as conductive painting and plating processes, used in mobile phones and other nonconductive small enclosures. The thermoformable film and extensible coating can also be part of larger electronic packages.

It has been discovered that thermoformable films, extensible conductive coatings and FIP gaskets can be combined to produce integral EMI shields which can be readily manufactured and shipped from a centralized location to smaller assembly plants for installation into electronic equipment.

The EMI shield is manufactured from a polymer thick film extensible conductive coating, that retains high electrical conductivity at high elongations, which is applied to a thermoformable film in combination with a FIP gasket. The EMI shield and FIP gasket provide EMI shielding of the entire interior of a given structure.

For example, suitable thermoformable films include LEXAN® and VALOX®, manufactured by the General Electric Company, Pittsfield, Mass. An example of a polymer thick film extensible conductive coating is Electrodag® SP-405, manufactured by Acheson Colloids Company, Port Huron, Mich.

Accordingly, in accordance with one embodiment, the invention is drawn to a method for forming an EMI shield. The method includes the steps of (a) providing a thermoformable film having a first side and a second side; (b) applying an extensible conductive coating to the thermoformable film; (c) cutting the thermoformable film; (d) thermoforming the thermoformable film into a three-dimensional shape; and (e) applying a compressible EMI gasket to the thermoformable film, wherein steps (b) through (e) may be performed in any order.

In another embodiment the invention is drawn to an EMI shield. The EMI shield includes a thermoformable film having a first side and a second side, wherein the thermoformable film is thermoformed into a three-dimensional shape; an extensible conductive coating applied to the thermoformable film; and a compressible EMI gasket attached to the thermoformable film.

In yet another embodiment, the extensible conductive coating includes an extensible film and conductive fibers. In another embodiment the glass transition temperature of the extensible film is lower than the glass transition temperature of the thermoformable film.

BRIEF DESCRIPTION OF THE DRAWINGS

The above and further advantages of this invention may be better understood by referring to the following description, taken in conjunction with the accompanying drawings, in which:

FIGS. 3A–3C are schematic diagrams of embodiments of a simple and a more complex thermoformed EMI shield;

FIGS. 4A–4C are process steps for contouring a thermoformable film;

FIG. 5 is a table summarizing surface resistivity and shielding effectiveness test results of conductive coatings made of various conductive materials and thermoformable materials.

DETAILED DESCRIPTION OF THE INVENTION

Figure 1:
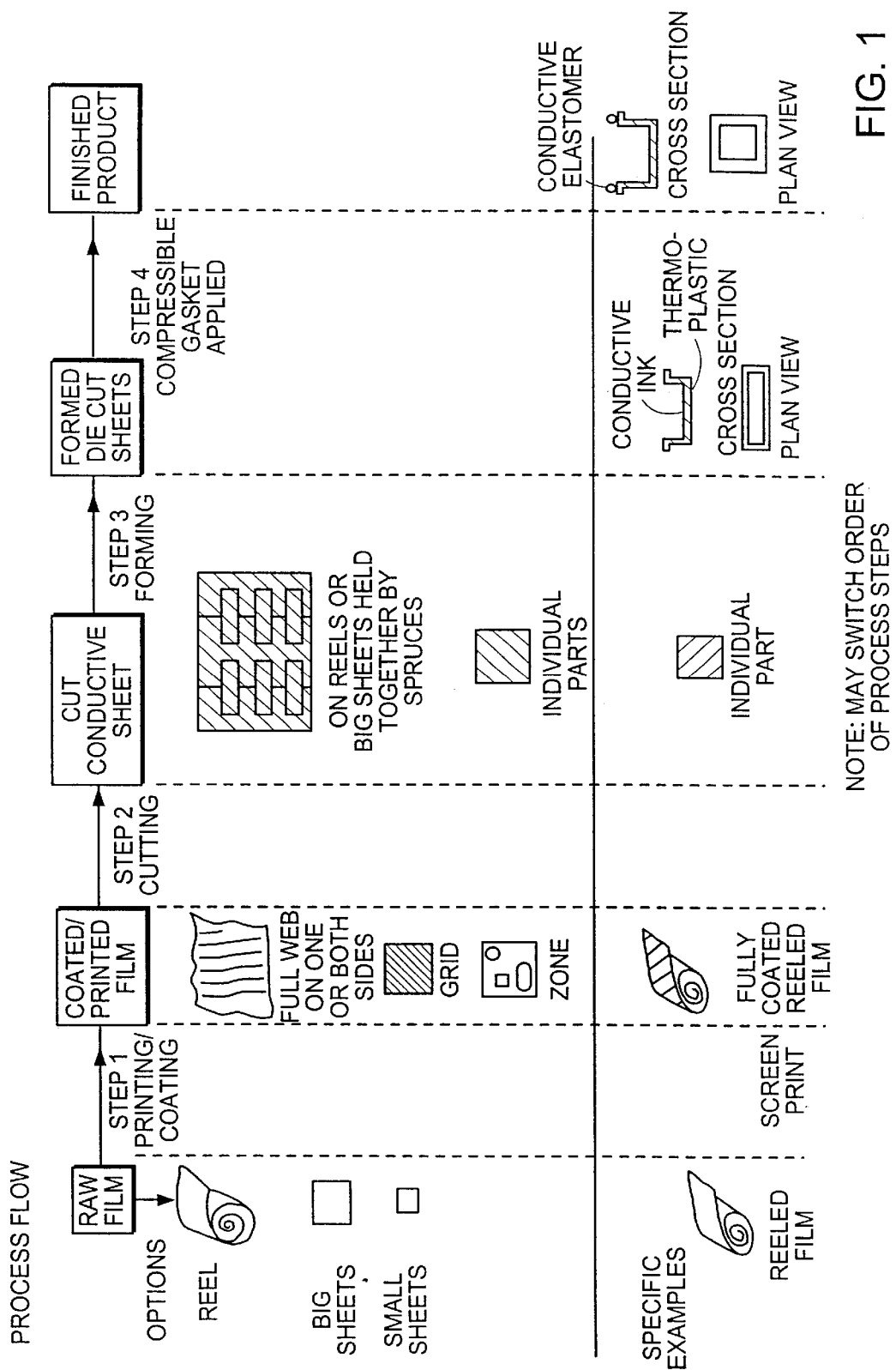
FIG. 1 is a process diagram of an embodiment of the current invention of a variety of methods for combining a formable nonconductive substrate with a conductive coating and a FIP gap gasket.

Examples of a process for manufacturing embodiments of EMI shields are illustrated in FIG. 1.

In a first step, the EMI shield is manufactured from a thermoformable film, such as General Electric's Lexan®. The thermoformable film may be in small or large sheets or a long continuous reel, depending on the scale of production required. Generally, a formable film may be used and, in addition, non-formable films may be used if the required shape is flat.

The thermoformable film is coated with a conductive extensible ink, such as Acheson Colloids Company's Electrodag® SP-405 ink to form an extensible conductive coating. The extensible ink may be any extensible ink in the case of a 3-D shape, and any conductive ink (or paint or plating) in the case of 2-D shapes. The extensible ink can be applied to the film by a variety of printing or film coating processes, such as flexographic printing, screen printing, gravure printing, offset printing, letter press printing, pad printing, slot coating, flood coating, spray coating, and jet printing.

Depending on the configuration of the part used during the forming process, there can be a considerable amount of elongation of the EMI shield where geometric features of the shield are concentrated. This in turn may put excessive stress on the extensible ink. If the elongation of the extensible ink is too severe, this will result in fracture of the conductive layer, which in turn leads to loss of conductivity and loss of shielding. Ideally, the conductive layer would be one that could be stretched infinitely over the entire part. In practice, this is difficult as most highly conductive materials will tend to fracture. Also, materials that are best for stretching are generally not conductive enough to be used as conductive shields.

Figure 2:
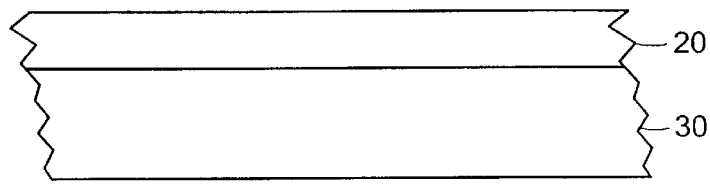
FIG. 2 is a schematic diagram of a conductive coating on a thermoformable film.

In another embodiment the extensible conductive coating can be formed from a combination of conductive fibers with an extensible film. The extensible film can be selected from materials that, in general, have a lower glass transition temperature than the thermoformable film and, in one embodiment, can be a polymer. The polymer selected for use with the conductive fibers can be very thermoplastic, to the point of almost becoming a liquid, which results in a combined polymer/conductive fiber layer that becomes highly compliant to changes in geometry caused by thermoforming the thermoformable film, while the conductive fibers continue to interact with negligible loss of conductivity. FIG. 2 illustrates an extensible conductive coating 20 on a thermoformable film 30.

In one embodiment the conductive fibers can be placed on the thermoformable film and the extensible film can be placed on top of the conductive fibers. The arrangement of the thermoformable film, the conductive fibers, and the extensible film can be laminated to allow the conductive fibers to integrate with the extensible film. In another embodiment, the extensible film can be processed into fibers which can be mixed with the conductive fibers. The mixture of conductive fibers and the fibers from the extensible film can be deposited on the thermoformable film at a temperature which at least partially melts the extensible film fibers.

Materials for the conductive fibers include stainless steel fibers from Baeckert, Naslon—SUS316L from Nippon Seisen Co. of Osaka-City, Japan, Panex Chopped Fiber—PX33CF1000-01 from Zoltex Corporation of St. Louis, Mo., and X-Static Silver Nylon Fiber from Instrument Specialties of Scranton, PA. Any fiber which is at least about 3.175 mm (0.125 inches) long and less than about 0.254 mm (0.01 inches) in diameter may be used, provided that the outer surface of the fiber is coated with metal sufficient to produce bulk resistivity of the material to less than about 50 milliohm-cm, preferably less than about 25 milliohm-cm, more preferably less than bout 10 milliohm-cm, as determined by Mil-G-83528 paragraph 4.6.11/ASTM 991. Pure component fibers can be used as well, provided the bulk resistivity is below about these values. In addition, some other conductive materials that can be used are silver loaded particles, silver/copper flake, silver/nylon fiber, silver carbon fibers, tin over copper flash, and tin.

Materials for the extensible film include polypropylene and polyethylene fibers or films, both available from Dow Chemicals. Other suitable polymers for the extensible film include polystyrene, acrylonitrile-butydiene-styrene (ABS), styrene-acrylonitrile (SAN), polycarbonate, polyester, and polyamide, as long as the thermoplastic polymer has a lower glass transition temperature than the supporting polymer shield, for example at least about 20 degrees C. lower. Additionally, a silicone material can also be used for the extensible film.

The extensible conductive coating can be made by blending polyethylene and/or polypropylene fibers with the conductive fibers and calendering or laminating the composite with the thermoformable film. Other methods for applying the extensible conductive coating to the thermoformable film include wet coating, carding, plating, coating, flocking, dry laid screening, and vacuum metal/ion sputter techniques.

Various combinations and permutations of the material for the conductive fibers, the material for the extensible film, and the method of applying the extensible conductive coating made from the extensible film and conductive fibers to the thermoformable film can be chosen to result in a desired surface conductivity and shielding effectiveness of the EMI shield.

In some embodiments the conductive coating may be applied to both sides of the thermoformable film. In other embodiments the conductive coating may be applied to one side of the thermoformable film. The conductive coating may be applied uniformly, or may be applied in a pattern, such as a grid. In still other embodiments the conductive coating may be applied in discrete areas or zones.

In a second step, the resulting coated film is then cut to the desired 2-D shape. Any cutting process known to those skilled in the art can be used such as water jet cutting, laser cutting die-cutting, hot wire cutting, etc. The film can be cut to produce a single shape or a plurality of similar or different shapes, which can be held together by sprues.

Figure 3B:
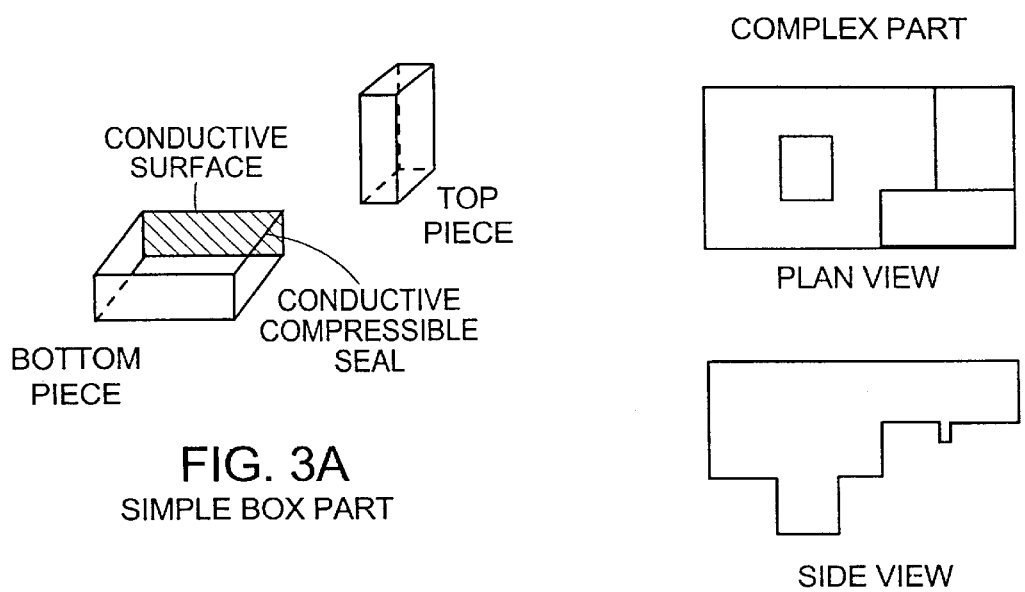

Next, in a third step, the cut film is thermoformed into the desired 3-D shape. Any method of thermoforming known to those skilled in the art may be used. The complexity of the 3-D shape can vary significantly, from a simple box, formed by a single rectangle draw, to a multi-chamber part with different chamber sizes and depths. See FIGS. 3A–3C for examples.

One method of thermoforming, positive forming, is illustrated in FIGS. 4A–4C. The thermoformable film 30 and the extensible conductive coating 20 are heated by a heater 50 to soften the thermoformable film 30 and the extensible conductive coating 20. The thermoformable film 30 and extensible conductive coating 20 are then applied to a mold 60 and a vacuum 70 drawn to conform the thermoformable film 30 and the conductive coating 20 to the mold 60. Once cooled sufficiently, the contoured thermoformable film 30 and extensible conductive coating 20 are removed from the mold 60.

Figure 6:
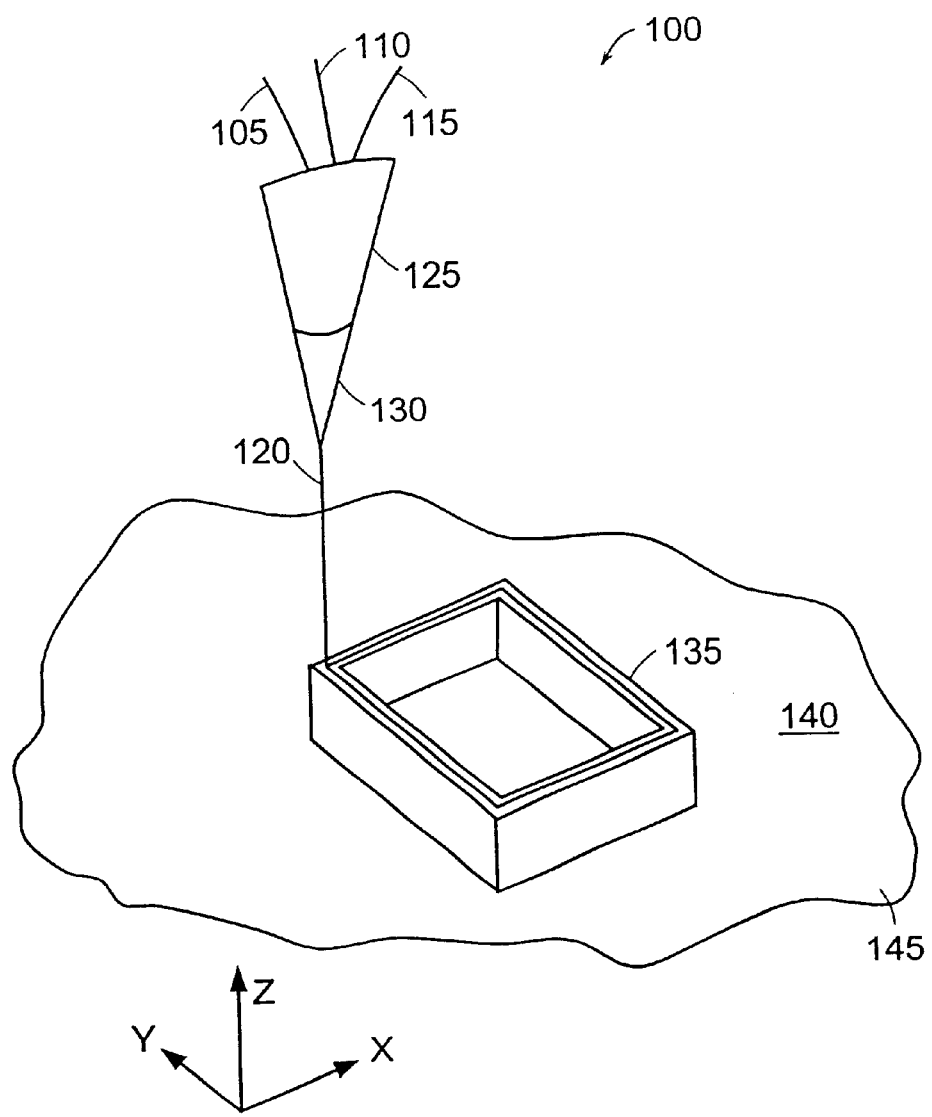
FIG. 6 is a schematic diagram of a FIP process on a contoured substrate.

Lastly, a conductive elastomer gasket is dispensed onto the coated thermoformed film in any desired pattern, using FIP dispensing equipment described below and illustrated in FIG. 6. The FIP gasket is typically applied about a perimeter, edge, lip, or other similar structure; however, in more complex parts, the FIP gasket may be applied to internal or external walls, dividers, or other similar surfaces forming with adjoining structure in the final assembled component or housing. The conductive elastomer gasket is then cured, either at ambient temperature or via elevated temperatures, for example, in a continuous oven.

In addition to using FIP methods for manufacturing the elastomer gasket, other gaskets known to those skilled in the art for shielding EMI can be used. For example, the gasket may be other than conductive elastomers including, but not limited to, metallized fabric wrapped foam gaskets, metal fingers, knitted gaskets, a printable foamable ink, etc. In some cases, the finished component may incorporate a separate environmental gasket, for example a polyurethane gasket.

Figure 3C:
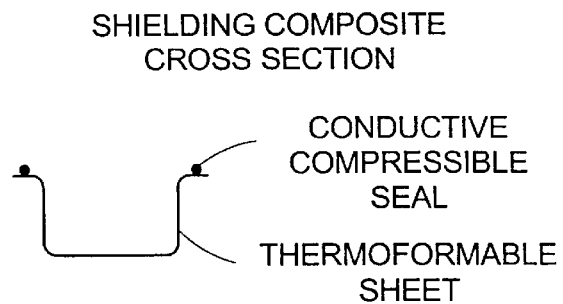

The finished shielding element is then shipped to the assembly plant, where the entire shielding function is accomplished by simply placing this single piece into an enclosure. Examples of shielding composite cross-sections are shown in FIG. 1, FIG. 3C, and FIG. 4.

Note that the four general process steps do not have to be performed in this particular order and, in fact, may be performed in any order. For example, the FIP gasket may be applied either before or after coating, cutting, or forming. Similarly, the coating may be applied either before or after cutting, forming, or application of the FIP gasket.

FIG. 5 is a table which shows a summary of surface resistivity and shield effectiveness test results for various conductive coatings. The table shows the conductive materials, the base extensible films, and the manufacturing methods for applying the conductive coating to the thermoformable film. The table also shows the thickness of the conductive coating and exemplary draw amounts of the conductive coating. The test results of surface resistivity and shielding effectiveness are provided for both an unformed conductive layer, after application of the extensible conductive coating to the thermoformable film and for a formed conductive layer after three-dimensional forming of the EMI gasket. The test results generally show the surface resistivity increases after the conductive layer has been three-dimensionally formed. The test results also generally show, with the exception of Ag particle ink, that the shielding effectiveness (SE) remains relatively constant before and after being three-dimensionally formed.

There are a number of ways to make a form in place gasket. For example, as illustrated in FIG. 6, is an embodiment of a method 100 for manufacturing an EMI shield made of conductive particles and a foamable mixture. In one embodiment, conductive particles 105, for example, chopped metal fibers or metallized polymer fibers, are added to the components of a foamable mixture. The components of the foamable mixture can be a polyol component 110 and an isocyonate component 115 of a urethane mixture. The polyol component 110, the isocyonate component 115, and the conductive particles 105 are mixed in one or more mixing heads 125 to produce a urethane mixture with an integral network of conductive particles 120.

The urethane mixture with the integral network of conductive particles 120 is then processed by available means to produce the desired size and shape of a conductive EMI gasket. In one embodiment, the urethane mixture with an integral network of conductive particles 120, is dispensed through a nozzle 130 directly onto a surface 135 of an electrical enclosure 140 using an xyz positioning system 145 to form the EMI gasket in place as the mixture 120 foams and cures.

FIP EMI gaskets may be manufactured of conductive foams, where the conductive elements are introduced into the foam matrix prior to casting by adding organo-metallic compounds to the foam chemical matrix, which are reduced to conductive elements during the foaming process.

Additionally, various forms of carbon may be added to urethane foam chemical precursors to produce foams with surface resistivities of 100 to 1000 ohms/square. These materials, however, have limited use in EMI shielding applications, due to the relatively high resistivity. A new process produces conductive foams which are less than 10 ohms/square by introducing more highly conductive materials into the foam chemical precursors, including silver-plated glass spheres, sintered metal particles which have bulk resistivities below about $10^{-5}$ ohm-cm (e.g. Cu, Al, Ni, Ag), and silver-plated copper particles. Other conductive materials include the class of non-metallic materials referred to as conductive polymers. This would include such materials as poly-Analine.

Another method of producing conductive foam is to produce the conductive elements in the foaming process by reacting organo-metallic compounds during the foaming process. This is accomplished by introducing reducing agents into one of the two or more chemical precursors of the foam prior to foaming. One example of these compounds is copper acetate, but any metal compound, which is compatible with one of the chemical foam precursors, could be used.

Examples of chemical foam systems which may be used include the very broad range of urethane foams including polyester and polyether types. Chloroprenes, more commonly known as neoprene rubber foams, could also be used.

Variations, modifications, and other implementations of what is described herein will occur to those of ordinary skill in the art without departing from the spirit and the scope of the invention.

What is claimed is:

1. An extensible conductive coating characterized at least in part by a surface resistivity, the extensible conductive coating comprising conductive fibers and an extensible film, wherein the conductive fibers are integrated into the extensible film such that the surface resistivity in an formed state is no more than about 20 times the surface resistivity in an unformed state, per drawn inch.

2. The extensible conductive coating of claim 1 wherein the conductive fibers are selected from the group consisting of stainless steel fibers, silver metallized fibers, silver loaded particles, silver/copper flake, silver/nylon fiber, silver carbon fibers, tin over copper flash, and tin.

3. The extensible conductive coating of claim 1 wherein an outer surface of the conductive fibers are coated with a metal sufficient to produce bulk resistivity of the extensible conductive coating per ASTM 991 to less than about 10 milliohm-cm.

4. The extensible conductive coating of claim 1 wherein the extensible film is selected from the group consisting of polypropylene, polyethylene, polystyrene, acrylonitrile-butydiene-styrene, styrene-acrylonitrile, polycarbonate, polyester, and polyamide.

* * * * *